United States Patent
Kumazawa

(10) Patent No.: US 7,164,979 B2
(45) Date of Patent: Jan. 16, 2007

(54) DATA TRANSMISSION SYSTEM AND OCCUPANT PROTECTION DEVICE

(75) Inventor: Hidehiko Kumazawa, Nagoya (JP)

(73) Assignee: Denso Corporation, Kariya (JP)

( * ) Notice: Subject to any disclaimer, the term of this patent is extended or adjusted under 35 U.S.C. 154(b) by 501 days.

(21) Appl. No.: 10/779,627

(22) Filed: Feb. 18, 2004

(65) Prior Publication Data

US 2004/0176892 A1    Sep. 9, 2004

(30) Foreign Application Priority Data

Mar. 7, 2003    (JP)    ............... 2003-062317

(51) Int. Cl.
*G08C 19/00*    (2006.01)
*B60R 21/00*    (2006.01)

(52) U.S. Cl. ............................ 701/45; 701/46; 701/47; 701/213; 341/118; 341/131

(58) Field of Classification Search ................... 701/45, 701/46, 47, 213; 341/61, 115, 118, 131, 341/155

See application file for complete search history.

(56) References Cited

U.S. PATENT DOCUMENTS 5,493,297 A * 2/1996 Nguyen et al. ............. 341/118
5,621,404 A * 4/1997 Heiss et al. .................... 341/61
5,668,552 A * 9/1997 Thurston .................... 341/143

FOREIGN PATENT DOCUMENTS

JP    A-H10-166993    6/1998

* cited by examiner

*Primary Examiner*—Tan Nguyen
(74) *Attorney, Agent, or Firm*—Posz Law Group, PLC

(57) ABSTRACT

A G sensor 31 generates a measuring value by measuring an impact acceleration applied to a vehicle. An A/D converter 32 converts the measuring value into a digital value with a resolution of K bits. A transmission interface 33 compresses the digital value into a compression digital signal of L bits being smaller than K bits. When the digital value is outside a given range from $(2^K-2^L)/2$ to $(2^K+2^L)/2$, the compression digital signal is generated by dividing the digital value by $2^{(K-L)}$. When within the given range, the compression digital signal is generated without dividing the digital value. The compression digital signal corresponding to the digital value within the given range thereby maintains the resolution of K bits. Thus, even using the single G sensor, a resolution of a compression digital signal can be varied based on a low or high intensity level of G.

13 Claims, 4 Drawing Sheets

FOR LOW G SIGNAL

FOR HIGH G SIGNAL

DATA TRANSMISSION SYSTEM AND OCCUPANT PROTECTION DEVICE

CROSS REFERENCE TO RELATED APPLICATIONS

This application is based on and incorporates herein by reference Japanese Patent Application No. 2003-62317 filed on Mar. 7, 2003.

FIELD OF THE INVENTION

The present invention relates to a data transmission system and an occupant protection device using the data transmission system.

BACKGROUND OF THE INVENTION

An occupant protection device such as an air bag device uses a data transmission system where a signal level varies within a predetermined range. For instance, as described in JP-A-H10-166993, an air bag device has satellite sensors disposed in several positions of a vehicle. Each of the satellite sensor has a G sensor for detecting as an acceleration an impact applied to the vehicle. The measuring value measured by the G sensor is converted to a digital signal through an A/D converter built in the satellite sensor, and then sent it to an air bag ECU via a transmission interface such as an I/O circuit. The air bag ECU determines presence or absence of the impact to control start of the air bag based on the received measuring value (i.e., impact acceleration).

In the above air bag device, to prevent the air bag from being mistakenly started, air bag expansion is designed to be not executed based on the measuring value of a single G sensor, but executed based on an AND condition with the measuring value of an additional sensor. As the additional sensor, a mechanical safing sensor or another G sensor capable of outputting the measuring signal corresponding to an impact acceleration applied to a vehicle can be used for this purpose.

When multiple G sensors are used for this purpose, the multiple G sensors are disposed in different positions within the vehicle. Based on the measuring values from the differently disposed G sensors, controlling the start of the air bag is executed. Differences among the measuring values from the different G sensors enable analyzing of transmission of the impact acceleration, determining the magnitude or strength level of the impact or the like.

Here, a G sensor in the proximity of an impact occurrence position needs to detect a very high level of an impact acceleration, while a G sensor away from the impact occurrence position needs to detect a relatively low level of the impact acceleration. In this case, a certain G sensor having a broad measuring range capable of detecting the high level of the impact acceleration tends to have a rough (or low) resolution, so that it is difficult for this certain G sensor to accurately measure the low level of the impact acceleration.

To measure the different levels of the impact acceleration, for instance, it is proposed that each of the satellite sensors has two G sensors that have a large range and a small range. When an impact occurrence position is near the satellite sensor, the G sensor having the large range is used for detecting. By contrast, when an impact occurrence position is away from the satellite sensor, the G sensor having the small range is used for detecting.

However, adopting this proposal increases the number of G sensors, and complicates a configuration for transmitting the measuring values from the two G sensors.

SUMMARY OF THE INVENTION

It is an object of the present invention to provide a data transmission system capable of varying a resolution by determining a signal level of a transmission signal.

To achieve the above object, a sending unit of a data transmission system is provided with the following. A signal generated with a predetermined range is converted to generate a digital value with a resolution of K bits. The digital value is then compressed to generate a digital signal of L bits, wherein L is smaller than K. The digital signal is then sent to a receiving unit. Here, when the digital value is outside a given range, the digital signal of L bits is generated by dividing the digital value by a first divisor of $2^{(K-L)}$. By contrast, when the digital value is within the given range, the digital signal of L bits is generated by dividing the digital value by a second divisor that is less than $2^{(K-L)}$.

In this structure, compression ratio is varied by whether the digital value is within the given range or not. This enables the digital value within the given range, i.e., the digital value of a lower level, to have a higher resolution when compressed to a digital signal of L bits.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS

A data transmission system according to an embodiment of the present invention is directed to an air bag device; however, the data transmission system can be also directed to occupant protection devices other than the air bag device. Further, the data transmission system can be directed to a given device other than the occupant protection devices. Here, in the given device, a resolution is required to be varied based on a level of a signal when the signal is transmitted.

Figure 1:
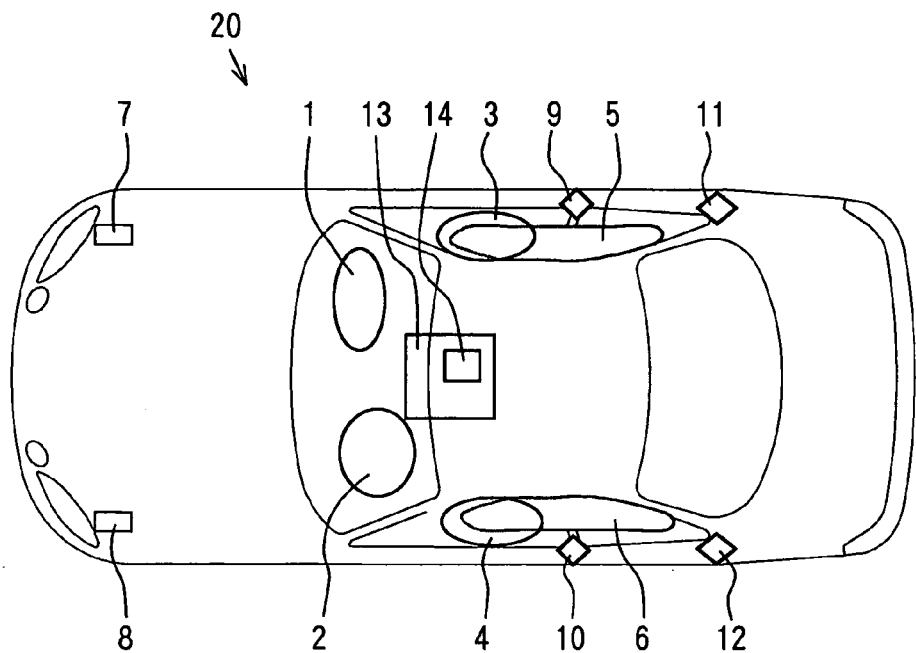
FIG. 1 is a diagram of an overall structure of an air bag device according to an embodiment of the present invention.

An overall structure of an air bag device provided in a vehicle is shown in FIG. 1. The air bag device 20 includes front air bags 1, 2 for a driver seat and a front passenger seat, side air bags 3, 4, and curtain air bags 5, 6. Each of the air bags 1 to 6 is expanded when a gas generating agent is ignited using a squib within an inflator (not shown).

The air bag device 20 includes acceleration sensors (G sensor) for detecting an impact applied to the vehicle. In detail, satellite sensors 1 to 12 including G sensors are disposed at multiple positions in the vehicle. Front satellite sensors 7, 8 are disposed at the left and right sides of a front portion of the vehicle for detecting an impact acceleration in a forward/rearward (longitudinal) direction of the vehicle. Pillar satellite sensors 9 to 12 are disposed at B pillar and C pillar around the both sides of the vehicle for detecting an impact acceleration in a side-to-side (lateral) direction of the vehicle.

These satellite sensors 7 to 12 are connected with an air bag ECU 13 via signal lines (not shown), so that an impact acceleration detected by the G sensor of each of the satellite sensors 7 to 12 is converted into a digital signal using an A/D converter to be sent to the air bag ECU 13.

The air bag ECU 13' contains an acceleration sensor 14 for detecting acceleration in the longitudinal direction of the vehicle. Suppose that the vehicle collides so that an impact acceleration occurs in the longitudinal direction. Here, the air bag ECU 13 determines whether the front air bags 1, 2 need to be expanded for protecting the occupant from the longitudinal impact based on the impact acceleration detected by the front satellite sensors 7, 8 and the internal acceleration sensor 14. When it is determined that the front air bags 1, 2 need to be expanded, gas is then generated from the inflator by supplying ignition electric current to the squib for expanding the air bags 1, 2.

Here, the impact acceleration is applied earlier on the front satellite sensors 7, 8 than the air bag ECU 13 owing to the disposition relationship. Therefore, determining the collision can be executed at earlier timing by using the impact acceleration from the front satellite sensors 7, 8. Further, detecting the impact acceleration with the front satellite sensors 7, 8 and the air bag ECU 13 enables detection of difference between impact transmission manners to both the sensors. This difference in the impact transmission manners varies according to intensity of the impact, so that the intensity of a given impact can be determined based on the difference in the transmission manners of the given impact. As a result, an appropriate expansion control can be executed for the front air bags 1, 2.

By contrast, suppose that the vehicle collides so that an impact acceleration occurs in the lateral direction of the vehicle. Here, the air bag ECU 13 determines whether the side and curtain air bags 3 to 6 need to be expanded based on the impact acceleration detected by the G sensors of the B or C pillar satellite sensors 9 to 12. Here, the collision occurs in either proximity of the B or C pillar satellite sensor. Also in this case, the intensity of the collision can be determined based on the impact accelerations detected by the differently disposed G sensors. As a result, an appropriate expansion control can be executed for the air bags 3 to 6.

Next, internal structures of the satellite sensors 7 to 12 will be explained below. All the satellite sensors 7 to 12 basically have the same structures, so that a structure of the B pillar satellite sensor 9 will be explained as an example with reference to FIG. 2.

The satellite sensor 9 includes a power/communication terminal and a GND terminal. The power/communication terminal is connected with a signal line commonly used for power supply and signal transmission. The GND terminal is connected with a DC-DC converter 34 generating power voltage of 5 V for supplying driving voltage to various circuits within the satellite sensor 9.

The satellite sensor 9 includes a G sensor 31, an A/D (Analog/Digital) converter 32, and a transmission interface (I/F) 33. The G sensor 31 is for detecting an impact acceleration due to impact allied to the vehicle and outputting a measuring value corresponding to the intensity of the impact acceleration. The G sensor 31 is designed as having, for instance, a measuring range of ±100 G for detecting lateral acceleration, i.e., both from the right side of the vehicle and from the left side of the vehicle. The positive side of the range is used for one lateral direction, while the negative for the other lateral direction. The measuring value (electric signal of 0 to 5 V) is thus outputted according to the impact acceleration from −100 G to +100 G.

The A/D converter 32 converts the measuring value (analog value) corresponding to the impact acceleration into a digital value. The A/D converter 32 converts the measuring value with a resolution of K bits (e.g., 10 bits) to have a sufficient accuracy for measuring values corresponding to a range of a low level (near 0 G) of the impact acceleration.

The transmission interface (I/F) 33 compresses the digital value outputted from the A/D converter 32 into a compression digital signal of L bits (e.g., 8 bits) being smaller than K bits used in the A/D converter 32. The transmission interface 33 sends the compression digital signal as a G signal to the air bag ECU 13. Generating method of this compression digital signal will be explained later.

The above G sensor 31, A/D converter 32, transmission interface 33, and DC-DC converter 34 are integrated as a sensor module 30. This sensor module 30 includes an oscillator 40 whose oscillating signal is used for a basis for operation of the preceding components.

Further, the transmission interface 33 generates a G mirror signal by reversing the G signal to send it along with the G signal. For instance, suppose that abnormality occurs owing to noise or the like in the transmission data including the G signal and G mirror signal. Even in this case, the air bag ECU 13 can recognize using a relationship between the G signal and G mirror signal the abnormal transmission data.

Figure 3:
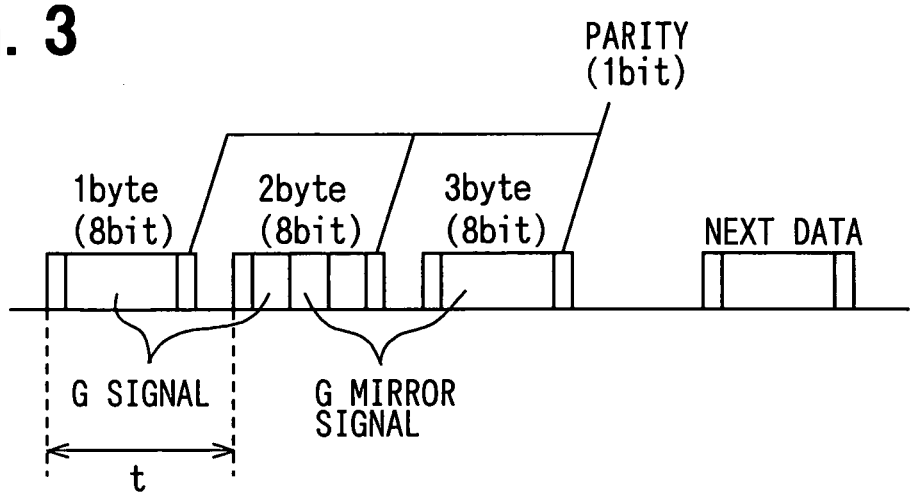
FIG. 3 is a diagram showing an example of data structure of transmission data sent by a transmission interface of the satellite sensor.

A data structure of the transmission data sent by the transmission interface 33 is shown in FIG. 3. A transmission data item of the transmission data is formed of three bytes so as to send a set of the G signal and G mirror signal using a transmission unit of one byte (8 bits). The first byte of the transmission data item includes a header of one bit and a parity of one bit, so that six bits of the G signal are included in the first byte. The second byte includes, in addition to two bits of the header and parity, remaining two bits of the G signal and 2 bits of the G mirror signal. The third byte includes, in addition to two bits of the header and parity, remaining six bits of the G mirror signal.

This transmission data item is decoded by being combined in a time series by the air bag ECU 13, which will be explained later. Here, it must be recognized whether a digital value having L bits is within a range of a low G signal or within a range of a high G signal. For this reason, recognition information representing a type of the digital signal is notified to the air bag ECU 13, for instance, using the header. In detail, a low G signal is sent with a header representing the low G signal, while a high G is sent with a header representing the high G signal. Recognition information can be also given to a vacant bit within the second byte of the transmission data item, instead of the header.

Figure 4:
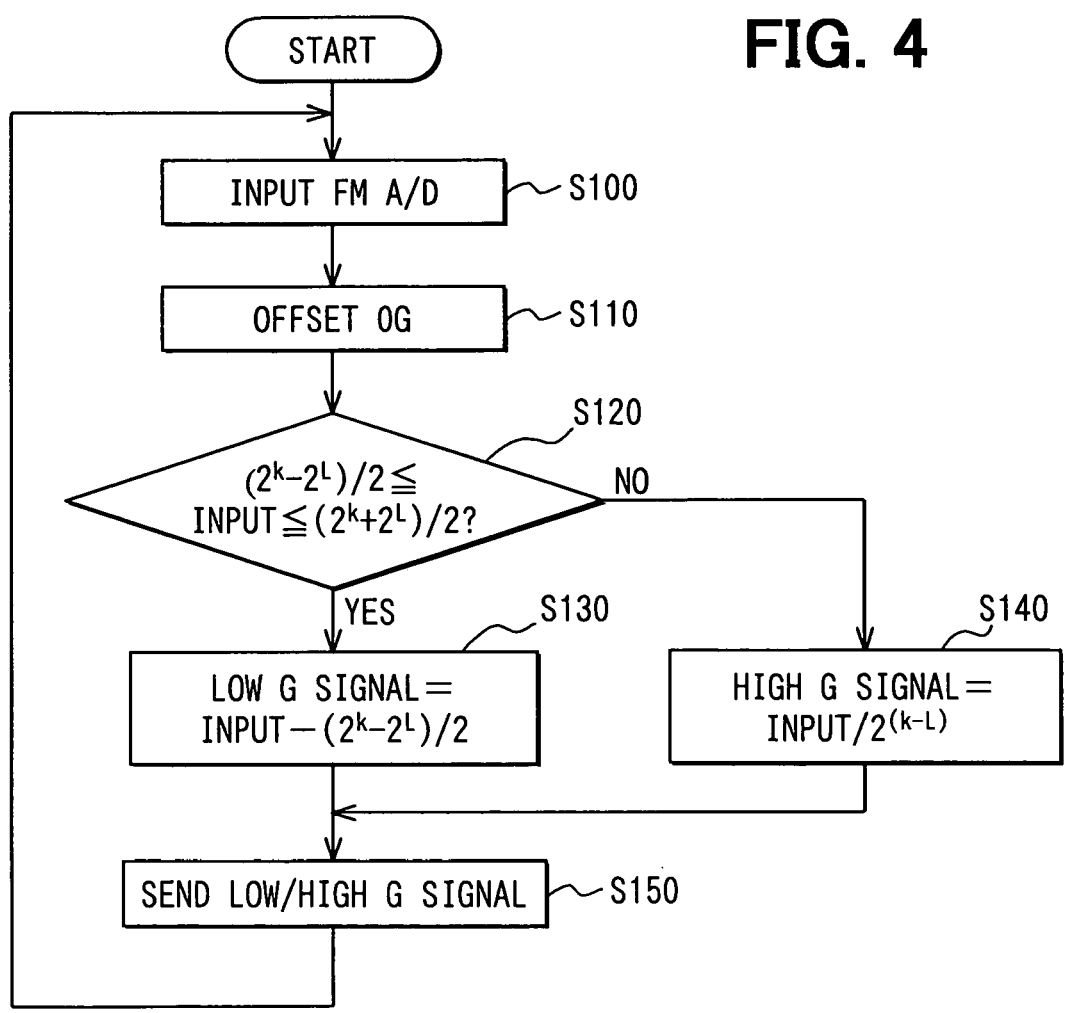
FIG. 4 is a flowchart diagram explaining processing of generating a compression digital signal by the transmission interface of the satellite sensor.

Next, a method for generating a compression digital signal by the transmission interface 33 of the satellite sensor 9 will be explained with reference to a flowchart in FIG. 4.

At Step 100, a digital value of K bits is inputted from the A/D converter 32. At Step 110, a 0 (zero) G offset is executed, for instance, as follows: to store a digital value corresponding to an offset value outputted from the G sensor when no acceleration is applied to the G sensor, or to obtain the offset value by learning; and to subtract the digital value corresponding to the offset value from an inputted digital value.

At Step 120, it is determined whether the inputted digital value is within a given range corresponding to an impact acceleration of a low level. Here, a relationship between a measuring value that is an impact acceleration measured by a G sensor and a digital value that is digitally converted with a resolution of K bits from the measuring value will be explained with reference to FIG. 5. Further, the given range corresponding to the low level will be also explained below.

Figure 5:
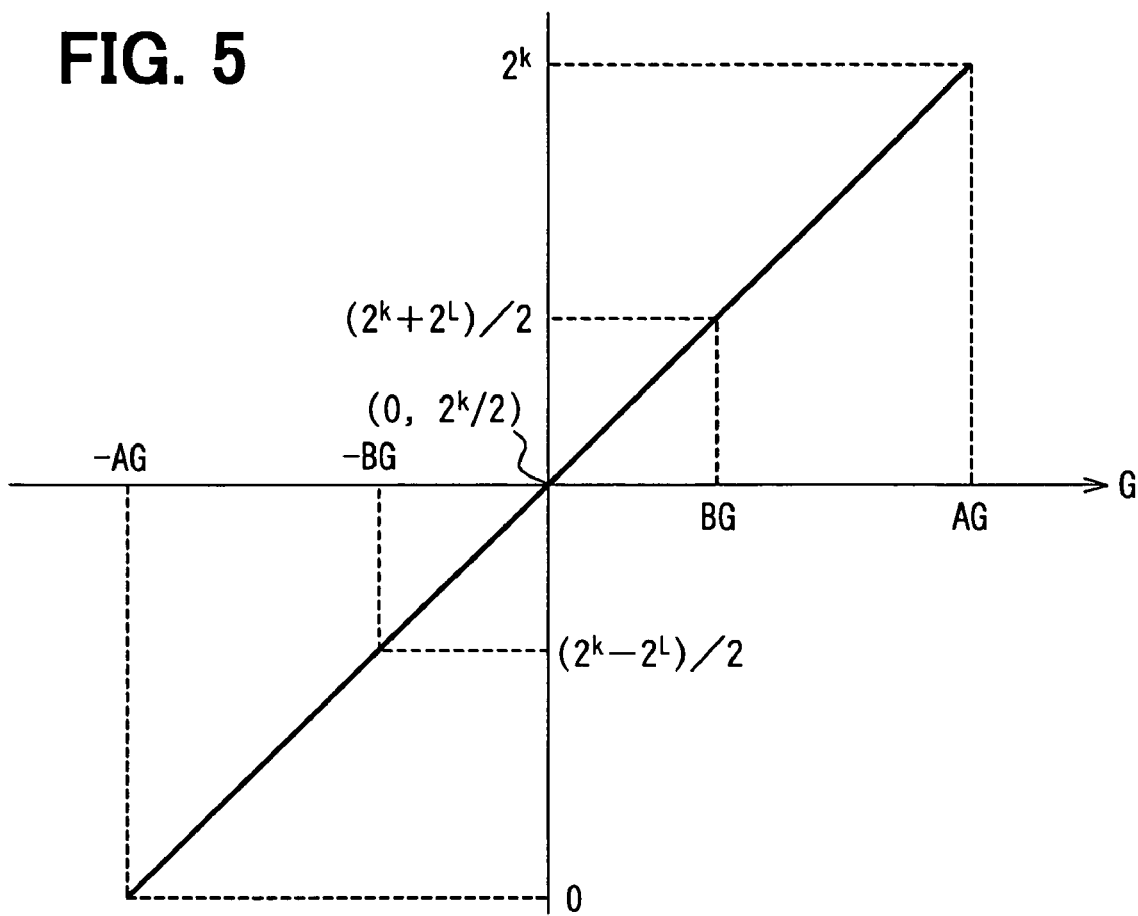
FIG. 5 is a diagram explaining a relationship between an impact acceleration and a digital value with a resolution of K bits.

The G sensor 31 has a measuring range of ±AG, while the A/D converter 32 converts the measured acceleration within the measuring range into a digital value with the resolution of K bits. As shown in FIG. 5, since digital values of zero or $2^K$ is assigned to −AG or +AG, respectively, a digital value of $2^K/2$ is represented by the measured acceleration of 0 (zero) G.

The transmission interface 33 compresses this digital value of K bits into a compression digital signal (G signal) of L bits that is smaller than K bits, and then sends the compression digital signal. Here, the transmission interface 33 varies the compression method by determining whether the digital value of K bits is within a given range (from $(2^K-2^L)/2$ to $(2^K+2^L)/2$, i.e., not less than $(2^K-2^L)/2$ and not more than $(2^K+2^L)/2$, or $(2^K-2^L)/2 \leq$ digital value $\leq (2^K+2^L)/2$). Further, a range of the measured acceleration corresponding to the digital values within the given range is shown as a range within ±BG in FIG. 5.

At first, a method for a condition where a digital value is within the given range will be explained with reference to FIG. 6A. The above given range (from $(2^K-2^L)/2$ to $(2^K+2^L)/2$) can be covered (or represented) by a digital signal of L bits, so that a digital value of K bits within the given range can be designated to a digital signal of L bits with one to one correspondence. In detail, as shown in FIG. 5, since $2^K/2$ is assigned to 0 G, a range of $\pm 2^L/2$ having a center of $2^K/2$ can be represented with a compression digital signal of L bits.

Therefore, when the determination at Step 120 is affirmed, the processing proceeds to Step 130. Here, a G signal of the low level (low G signal) corresponding to the measured acceleration within the range of ±BG is computed only by subtracting $(2^K-2^L)/2$ from the inputted digital value. This subtracting is adjustment relevant to the bias of the measuring range. In detail, by subtracting $(2^K-2^L)/2$, "$(2^K-2^L)/2 \leq$ digital value $\leq (2^K+2^L)/2$)" is adjusted to "$0 \leq$ adjusted digital value $\leq 2^L$," as shown in FIG. 6A, resulting in being represented by a compression digital signal within L bits. This low G signal thereby has a resolution equivalent to that of K bits although a compression digital signal of L bits is used. Namely, the low G signal is not divided, so that not only the low G signal prior to the subtracting but also the low G signal posterior to the subtracting has one to one correspondence with the digital value of K bits within the given range.

By contrast, when the determination at Step 120 is negated, the processing proceeds to Step 140. Here, the inputted digital value cannot be designated as a digital value of L bits with the same resolution of K bits. A high G signal is computed by dividing the inputted digital value by a divisor of $2^{(K-L)}$.

Figure 6A:
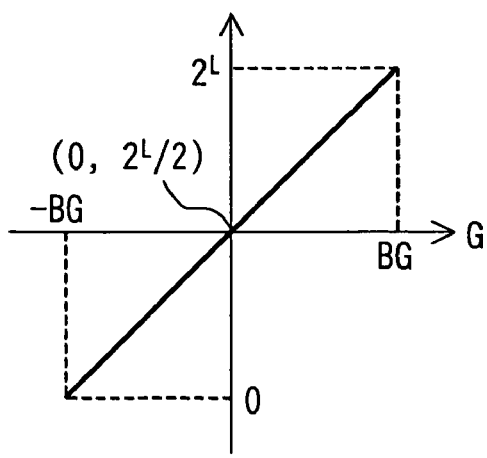
FIG. 6A is a diagram showing a measuring range between −BG and +BG with a resolution of K bits for a low G signal.
Figure 6B:
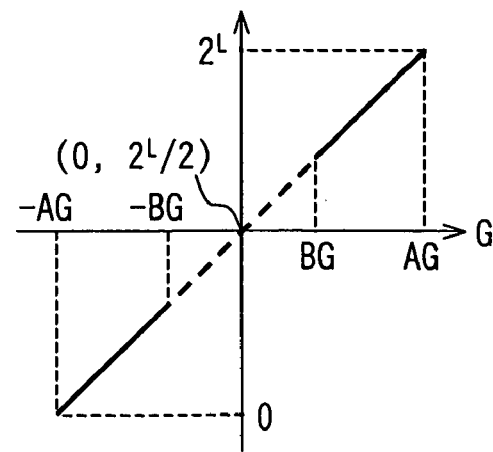
FIG. 6B is a diagram showing a measuring range between −AG and +AG with a resolution of L bits for a high G signal.

As explained above, a low G signal becomes a signal having a range from −BG to +BG with a resolution of K bits, as shown in FIG. 6A. By contrast, a high G signal becomes a signal having a range from −AG to +AG (excluding a range of ±BG) with a resolution of L bits, as shown in FIG. 6B. Thus, the individual high and low G signals are generated so that the low G signal can maintain a relatively higher resolution than the high G signal.

Figure 2:
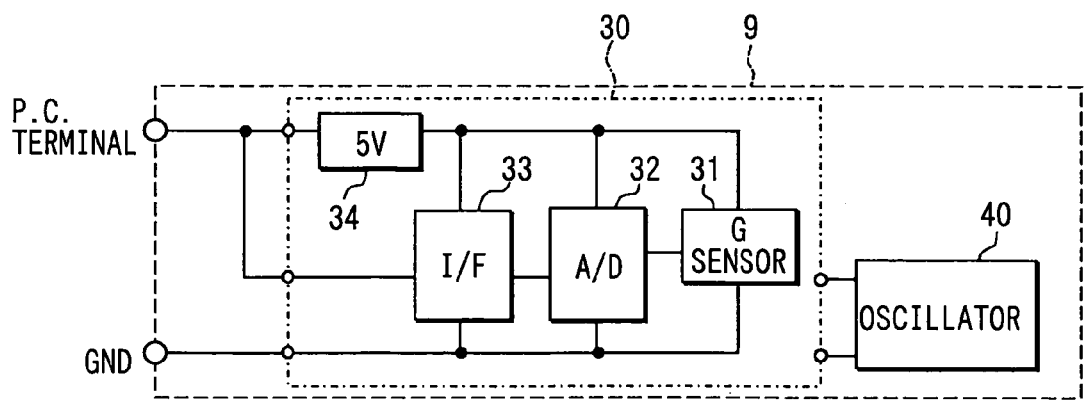
FIG. 2 is a diagram of an internal structure of a satellite sensor.

After the low or high G signal is generated, at Step 150 in FIG. 2, the transmission data including these G signals is sent. The transmission data includes the G mirror signals in addition to the G signals, as explained above. The processing at Step 150 thereby includes processing of generating the G mirror signals.

Next, the air bag ECU 13 will be explained below. The air bag ECU 13 receives transmission data including G and G mirror signals from the satellite sensors 7 to 12 to execute collision determination and expansion control of the air bags based on the G signals.

Figure 7:
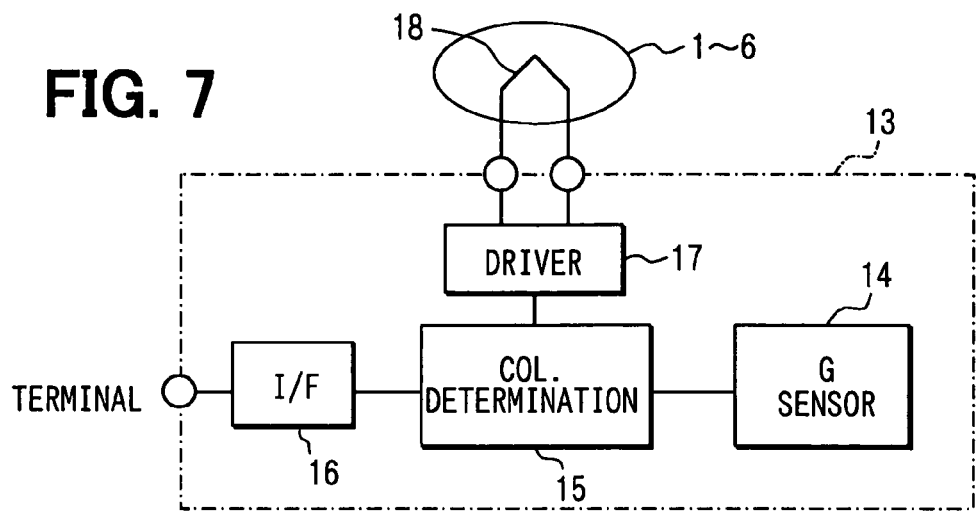
FIG. 7 is a diagram showing an internal structure of an air bag ECU.

An internal structure of the air bag ECU 13 is shown in FIG. 7. The air bag ECU 13 includes an internal acceleration sensor 14, a collision determination unit 15, a driver circuit 17, and a transmission interface (I/F) 16.

The transmission interface 16 receives the transmission data from the individual satellite sensor 7 to 12 to generate a high resolution G signal from a low G signal and a low resolution G signal from a high G signal. The processing of the transmission interface 16 will be explained later.

The collision determination unit 15 determines the occurrence of the collision based on the G signals sent from the individual satellite sensors 7 to 12 and the G signal sent from the internal acceleration sensor 14. When the collision is determined to have occurred, the air bag ECU 13 supplies ignition electric current to a squib 18 of a corresponding air bag 1 to 6 using the driver circuit 17 for expanding the corresponding air bag 1 to 6 according to a condition of the collision.

In particular, when an impact acceleration is applied to the vehicle from the side of the vehicle, the expansion control for the side air bags 3, 4 and curtain air bags 5, 6 are executed based on the G signals of the B pillar or C pillar satellite sensors 9 to 12 around the side to which the impact acceleration is applied or around the opposite side.

Figure 8:
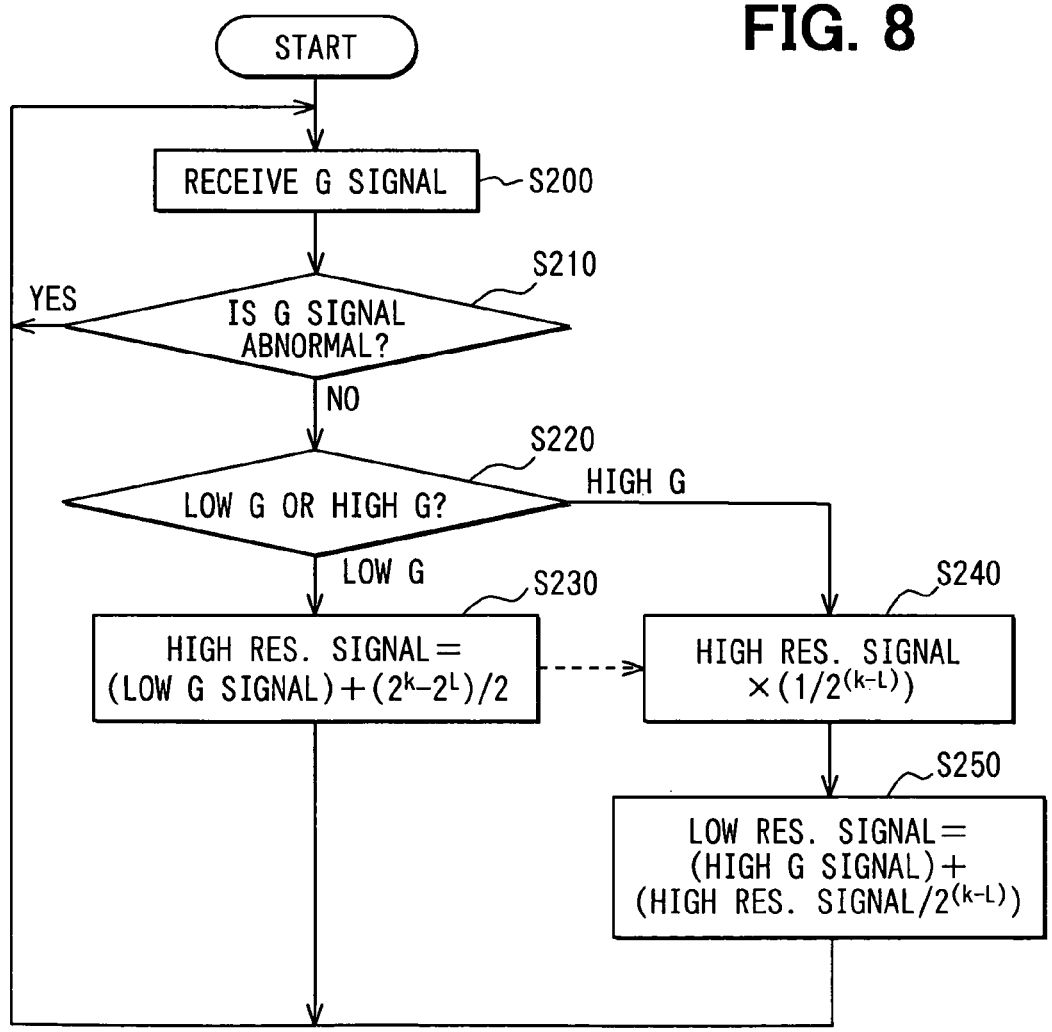
FIG. 8 is a flowchart diagram explaining processing of the transmission interface of the air bag ECU.

Next, the processing of the transmission interface 16 of the air bag ECU 13 will be explained with reference to a flowchart in FIG. 8. At Step 200, the transmission interface 16 receives the transmission data including the G and G mirror signals from the individual satellite sensors 7 to 12. At Step 210, an abnormality determination is executed based on the parity bit or the correspondence relation between the G signal and G mirror signal. Here, when the correspondence relation between the G signal and G mirror signal is abnormal or the transmission data is determined to be abnormal based on the parity check, the G signal included in the transmission data has possibility of being abnormal owing to noise or the like. The processing thereby returns to Step 200 without undergoing the subsequent steps.

At Step 210, when the transmission data is determined to be not abnormal, the processing proceeds to Step 220. Here, whether the received G signal is a low G signal or high G signal based on the header included in the transmission data. When the received transmission data is determined to be a low G signal, the processing proceeds to Step 230. Here, $(2^K-2^L)/2$ is added to the low G signal to compute a high resolution G signal (conversion from L bits to K bits). As a result, the computed high resolution G signal can be used for other processings preferably utilizing the high resolution of K bits.

In addition, the computed high resolution G signal is also used for computing the entire low resolution G signal. Namely, after the high resolution G signal is computed at Step 230, the computed high resolution G signal is handed over to processing at Step 240. Here, as the high resolution G signal computed at Step 230 is obtained, the high resolution G signal is then divided by a divisor of $2^{(K-L)}$ (conversion to $\frac{1}{2}^{(K-L)}$). This enables the resolutions of the high G and low G signals to become equivalent (or be coordinated).

Here, the high G signals are the set of signals outside the given range (from $(2^K-2^L)/2$ to $(2^K+2^L)/2$), signals within the given range look to be removed from the measuring values by the individual satellite sensors 7 to 12. This prevents the high G signals from being easily used for other subsequent processings. The air bag ECU 13 thereby needs to combine in the time series the low G and high G signals to reproduce the entire measuring values. For this purpose, the high resolution G signal generated from the low G signal is handed over to processing at Step 250 where the low resolution G signal is generated from the high G signal.

However, the low G and high G signals are generated with the different methods, so that simple combination of the two G signals does not result in reproducing, by decoding the G signals, signals corresponding to the original measuring values.

Therefore, through the processing at Steps 230, 240, the low G signal and high G signal are coordinated into the same dimension. After the processing at Step 240, the high resolution G signal that is divided by $2^{(K-L)}$ is treated as a part of the low resolution G signal.

Further, when the received G signal is determined to be a high G signal, the received G signal undergoes no processing at Step 240 to be handed over to the processing at Step 250. Namely, the high G signal becomes a low resolution G signal without any division.

Thus, combining the low G and high G signals in the time series according to the reception timings enables producing of the G signals representing the entire variation of the measuring values.

Through the processing by the above satellite sensors 7 to 12 and the processing by the air bag ECU 13, when the impact acceleration is small, a highly accurate low G signal with the high resolution is obtained even using a single G sensor at each of the satellite sensors 7 to 12. The G sensor and the structure where the G signal from the G sensor is sent can be simplified, contributing the reduction of costs. Further, the transmission data can be sent by a unit of 8 bits, so that a general-purpose transmission unit can be used for sending the transmission data, also contributing to the cost reduction.

(Modification)

The above embodiment can be modified below. For instance, in the above-mentioned embodiment, the given range for a digital value of K bits is defined as a range from $(2^K-2^L)/2$ to $(2^K+2^L)/2$. Thus, a digital value of K bits that is within the given range can be favorably converted to a compression digital signal of L bits without changing a resolution of K bits. However, the given range can be changed to a different certain range (e.g., from $(2^K-2^W)/2$ to $(2^K+2^W)/2$ [K>W>L]) at most from 0 to $2^K$. Here, converting a digital value of K bits with the certain range to that of L bits requires compression or division using a certain divisor (e.g., $2^{(W-L)}$) that is at most $2^{(K-L)}$. Namely, a compression ratio can be lowered than $2^{(K-L)}$. After being compressed to compression digital signals of L bits, a compression digital signal corresponding to a digital value of K bits within the certain range can have a higher resolution by (K-W) bits than a corresponding digital signal corresponding to a digital value outside the certain range. Further, in this modification, the digital value divided by the certain divisor needs to be coordinated with the digital value divided by $2^{(K-L)}$ when it is decoded for producing the low resolution signals, similarly with the processing at Steps 240, 250 in FIG. 8. Namely, the digital value divided by the certain divisor is coordinated by being divided by ($2^{(K-L)}$/certain divisor, e.g., $2^{(K-L)}/2^{(W-L)}=2^{(K-W)}$).

Further, in the above-mentioned embodiment, with respect to an air bag device, a measuring value of an impact acceleration applied to a vehicle is converted into a G signal. The impact acceleration is applied to the vehicle in one of four directions, i.e., laterally and longitudinally in both back and forth directions. Therefore, both the positive impact acceleration (e.g., +100 G) and the negative impact acceleration (e.g., −100 G) must be covered as a measuring value. When a measuring value is converted into a digital value of K bits, the negative one is represented with a range from 0 to $2^K/2$ and the positive one is represented with a range from $2^K/2$ to $2^K$. However, suppose that a measuring value is only either of positive or negative. Here, the measuring value of zero is represented by zero of a digital value of K bits, so that the adjustment pertinent to the bias of the measuring range that is explained at Step 130 in FIG. 4 is unnecessary.

Further, in the above-mentioned embodiment, each of the transmission interfaces of the individual satellite sensors 7 to 12 executes processing of generating transmission data including a G signal and the like, and the transmission interface 16 of the air bag ECU 13 then executes processing of decoding and the like. However, the processing of generation or decoding can be also executed by a dedicated signal processing circuit or, with respect to the air bag ECU 13, by the collision determination unit 15.

It will be obvious to those skilled in the art that various changes may be made in the above-described embodiments of the present invention. However, the scope of the present invention should be determined by the following claims.

What is claimed is:

1. A data transmission system having a sending unit and a receiving unit, the sending unit comprising:

signal generating means for generating a signal that varies within a predetermined range;

converting means for converting the signal having the predetermined range to generate a digital value with a resolution of K bits;

compressing means for compressing the digital value generated by the converting means to generate a digital signal of L bits, wherein L is smaller than K; and sending means for sending the digital signal generated by the compressing means to the receiving unit, wherein the compressing means includes determining means for determining whether the digital value generated by the converting means is within a given range, wherein, when the digital value is outside the given range, the digital signal of L bits is generated by dividing the digital value by a first divisor, wherein, when the digital value is within the given range, the digital signal of L bits is generated by dividing the digital value by a second divisor, and wherein the first divisor is $2^{(K-L)}$, while the second divisor is less than $2^{(K-L)}$.

2. The data transmission system of claim 1,
wherein the sending unit further comprises:
mirror signal generating means for generating a mirror signal by reversing the digital signal generated by the compressing means, and
wherein the sending means sends the mirror signal along with the digital signal.

3. The data transmission system of claim 2,
wherein, when the sending means sends the mirror signal along with the digital signal, the sending means divides the digital signal and the mirror signal into portions, each of the portions is formed of certain bits, and serially sends the divided portions.

4. The data transmission system of claim 1,
wherein, when the given range is within a range covered by a digital signal of L bits, the second divisor is designated as $2^0$ (=1) and the digital value within the given range has one to one correspondence with the generated digital signal of L bits.

5. The data transmission system of claim 4,
wherein the signal generated by the signal generating means varies in a time series,
wherein the sending unit repeatedly sends, in the time series, the digital signal corresponding to the varied signal, and
wherein the receiving unit comprises:
recognizing means for recognizing whether the received digital signal is generated by dividing the digital value by the first divisor;
dividing means for dividing by the first divisor the received digital signal that is recognized to be not generated by dividing the digital value by the first divisor; and
decoding means for reproducing the signal generated by the signal generating means by combining in the time series the digital signal generated by dividing the digital value by the first divisor by the compressing means and the digital signal divided by the first divisor by the dividing means.

6. The data transmission system of claim 1,
wherein the signal generated by the signal generating means varies in a time series,
wherein the sending unit repeatedly sends, in the time series, the digital signal corresponding to the varied signal, and
wherein the receiving unit comprises:
selecting means for selecting the received digital signal that is generated by dividing the digital value by the second divisor by the compressing means;
coordinating means for coordinating the selected digital signal by applying, to the selected digital signal, multiplication by a value of the second divisor and division by the first divisor; and
decoding means for reproducing the signal generated by the signal generating means by combining in the time series the digital signal generated by dividing the digital value by the first divisor by the compressing means and the digital signal coordinated by the coordinating means.

7. An occupant protection device provided in a vehicle, including:
a protecting unit for protecting an occupant of the vehicle;
a plurality of satellite sensors, each of the satellite sensors having
an impact measuring unit for measuring an impact applied to the vehicle, and
a sending unit for sending a signal representing the impact measured by the impact measuring unit; and
a start controlling unit for controlling start of the protecting unit based on the signal sent by the sending unit,
the sending unit comprising:
converting means for converting the signal having a predetermined range to generate a digital value with a resolution of K bits; and
compressing means for compressing the digital value generated by the converting means to generate a digital signal of L bits, wherein L is smaller than K,
wherein the sending unit sends to the start controlling unit the digital signal generated by the compressing means,
wherein the compressing means includes determining means for determining whether the digital value generated by the converting means is within a given range,
wherein, when the digital value is outside the given range, the digital signal of L bits is generated by dividing the digital value by a first divisor,
wherein, when the digital value is within the given range, the digital signal of L bits is generated by dividing the digital value by a second divisor, and
wherein the first divisor is $2^{(K-L)}$, while the second divisor is less than $2^{(K-L)}$.

8. The occupant protection device of claim 7,
wherein the sending unit further comprises:
mirror signal generating means for generating a mirror signal by reversing the digital signal generated by the compressing means, and
wherein the sending unit sends the mirror signal along with the digital signal.

9. The occupant protection device of claim 8,
wherein, when the sending unit sends the mirror signal along with the digital signal, the sending unit divides the digital signal and the mirror signal into portions, each of the portions is formed of certain bits, and serially sends the divided portions.

10. The occupant protection device of claim 7,
wherein, when the given range is within a range covered by a digital signal of L bits, the second divisor is designated as $2^0$ (=1) and the digital value within the given range has one to one correspondence with the generated digital signal of L bits.

11. The occupant protection device of claim 10,
wherein the signal generated by the signal generating means varies in a time series,
wherein the sending unit repeatedly sends, in the time series, the digital signal corresponding to the varied signal to the start controlling unit, and
wherein the start controlling unit comprises:
recognizing means for recognizing whether the received digital signal is generated by dividing the digital value by the first divisor;
dividing means for dividing by the first divisor the received digital signal that is recognized to be not generated by dividing the digital value by the first divisor; and
decoding means for reproducing the signal generated by the signal generating means by combining in the time series the digital signal generated by dividing the digital value by the first divisor by the compressing means and the digital signal divided by the first divisor by the dividing means.

12. The occupant protection device of claim 7,
wherein the signal generated by the signal generating means varies in a time series, wherein the sending unit repeatedly sends, in the time series, the digital signal corresponding to the varied signal, and wherein the start controlling means comprises:

selecting means for selecting the digital signal that is generated by dividing the digital value by the second divisor by the compressing means;

coordinating means for coordinating the selected digital signal by applying, to the selected digital signal, multiplication by a value of the second divisor and division by the first divisor; and decoding means for reproducing the signal generated by the signal generating means by combining in the time series the digital signal generated by dividing the digital value by the first divisor by the compressing means and the digital signal coordinated by the coordinating means.

13. The occupant protection device of claims 7, wherein the satellite sensors are disposed around both sides of the vehicle to measure an impact applied to the vehicle in a lateral direction of the vehicle, and wherein the start controlling unit controls the start of the protecting unit based on the signals sent from the satellite sensors.

* * * * *